(12) United States Patent
Lee et al.

(10) Patent No.: US 7,589,976 B1
(45) Date of Patent: Sep. 15, 2009

(54) EXPANSION CARD SLOT STRUCTURE

(75) Inventors: Chu-Huesh Lee, Taipei (TW); Chi-Jung Chan, Sijhih (TW)

(73) Assignee: Wieson Technologies Co., Ltd., Sijhih, Taipei County (TW)

( * ) Notice: Subject to any disclaimer, the term of this patent is extended or adjusted under 35 U.S.C. 154(b) by 0 days.

(21) Appl. No.: 12/109,448

(22) Filed: Apr. 25, 2008

(51) Int. Cl.
    *H05K 7/14* (2006.01)
(52) U.S. Cl. .................... 361/807; 361/809; 361/810
(58) Field of Classification Search ........... 361/753, 361/799, 800, 816, 818, 801, 807, 808, 809, 361/810, 726, 732, 747, 759
See application file for complete search history.

(56) References Cited

U.S. PATENT DOCUMENTS 6,552,913 B2 * 4/2003 Tournadre ............... 361/759
6,717,818 B1 * 4/2004 Lin ......................... 361/753
6,985,360 B2 * 1/2006 Chen et al. ................ 361/704

* cited by examiner

*Primary Examiner*—Dameon E Levi
(74) *Attorney, Agent, or Firm*—Roger H. Chu

(57) ABSTRACT

The present invention discloses an improved expansion card slot structure including a slot base with a plurality of rear-end fixing pins, and a shield bracket installed at the slot base for shielding a rear-end port of the slot base and allowing a plurality of contact portions of the shield bracket to be in contact respectively with an upper end of each rear-end fixing pin, and a plurality of elastic arms to be in contact respectively with a main body portion of each rear-end fixing pin and disposed proximate to a lower end of each rear-end fixing pin. With this structure, the invention increases the number of electromagnetic interference (EMI) contact points and provides a shorter path for grounding and eliminating noises to improve the electromagnetic interference (EMI) effect.

6 Claims, 5 Drawing Sheets

EXPANSION CARD SLOT STRUCTURE

FIELD OF THE INVENTION

The present invention relates to an improved expansion card slot structure, and more particularly to an improved expansion card slot structure that increases the number of electromagnetic interference (EMI) contact points and provides a shorter path for grounding and eliminating noises to improve the electromagnetic interference (EMI) effect.

BACKGROUND OF THE INVENTION

In general, an electronic device such as a TV tuner box or a computer usually installs a port (USB port, network port, mouse port or speaker port, etc) on its main board, and a so-called electromagnetic interference (EMI) device such as a conducting plate is provided for grounding and eliminating noises to provide a good signal transmission quality without being affected by the noises.

Referring to FIGS. 1 and 2 respectively for a perspective view and an enlarged view of a traditional expansion card slot used in a computer for installing a wireless network card, a memory card or an external hard disk, the expansion card slot structure 9 includes a slot base 91, an insert slot disposed at the front end of the slot base 91, a rear-end port 912, and a shield bracket 92 installed at the rear-end port 912 for providing an electromagnetic interference (EMI) effect.

In FIGS. 1 and 2, the slot base 91 comprises a plurality of fixing pins 93, each having an upper distal edge 931 and a lower distal edge 932, wherein the lower distal edge 932 includes a latch portion 933 installed on a main board (not shown in the figure).

In a traditional design, the shield bracket 92 comprises a plurality of contact points 921 in contact respectively with the upper distal edge of each fixing pin 93. The foregoing contact points 921 of the shield bracket 92 are electrically coupled with the upper distal edge 931 of the fixing pin 93 for achieving the effect of grounding and eliminating noises (or known as an electromagnetic interference (EMI) effect).

From the description above, the traditional structural design can achieve the effect of grounding and eliminating noises by contacting the contact point 921 of the shield bracket 92 with the upper distal edge 931 of the fixing pin 93, but the grounding path is limited to two contact points only, and the path for grounding the noises is longer, and thus the electromagnetic interference (EMI) effect is lowered and the life expectancy of the electronic device is affected adversely.

BRIEF SUMMARY OF THE INVENTION

The primary objective of the present invention is to overcome the shortcomings of the prior art by providing an improved expansion card slot structure that comprises a slot base, a plurality of rear-end fixing pins and a shield bracket, wherein the slot base includes a front-end insert slot and a rear-end port, and a plurality of rear-end fixing pins are installed at the slot base and disposed proximate to a rear-end port of the slot base, and each rear-end fixing pin includes a main body portion, an upper end and a lower end.

The shield bracket is installed at the slot base and covered onto the rear-end port of the slot base, and the shield bracket includes a plurality of contact portions and a plurality of elastic arms, wherein each contact portion is in contact with an upper end of each rear-end fixing pin, and each elastic arm is in contact with a main body portion of each rear-end fixing pin and disposed proximate to a lower end of each rear-end fixing pin.

With the foregoing structure, the electromagnetic interference (EMI) contact points at the plurality of contact portions and the plurality of elastic arms of the shield bracket are increased, wherein the plurality of elastic arms come with a shorter path for grounding and eliminating noises, and thus the invention can improve the electromagnetic interference (EMI) effect and extend the life expectancy of the electronic devices.

To make it easier for our examiner to understand the technical characteristics and effects of the present invention, we use preferred embodiments and related drawings for the detailed description of the present invention as follows:

DETAILED DESCRIPTION

Figure 1:
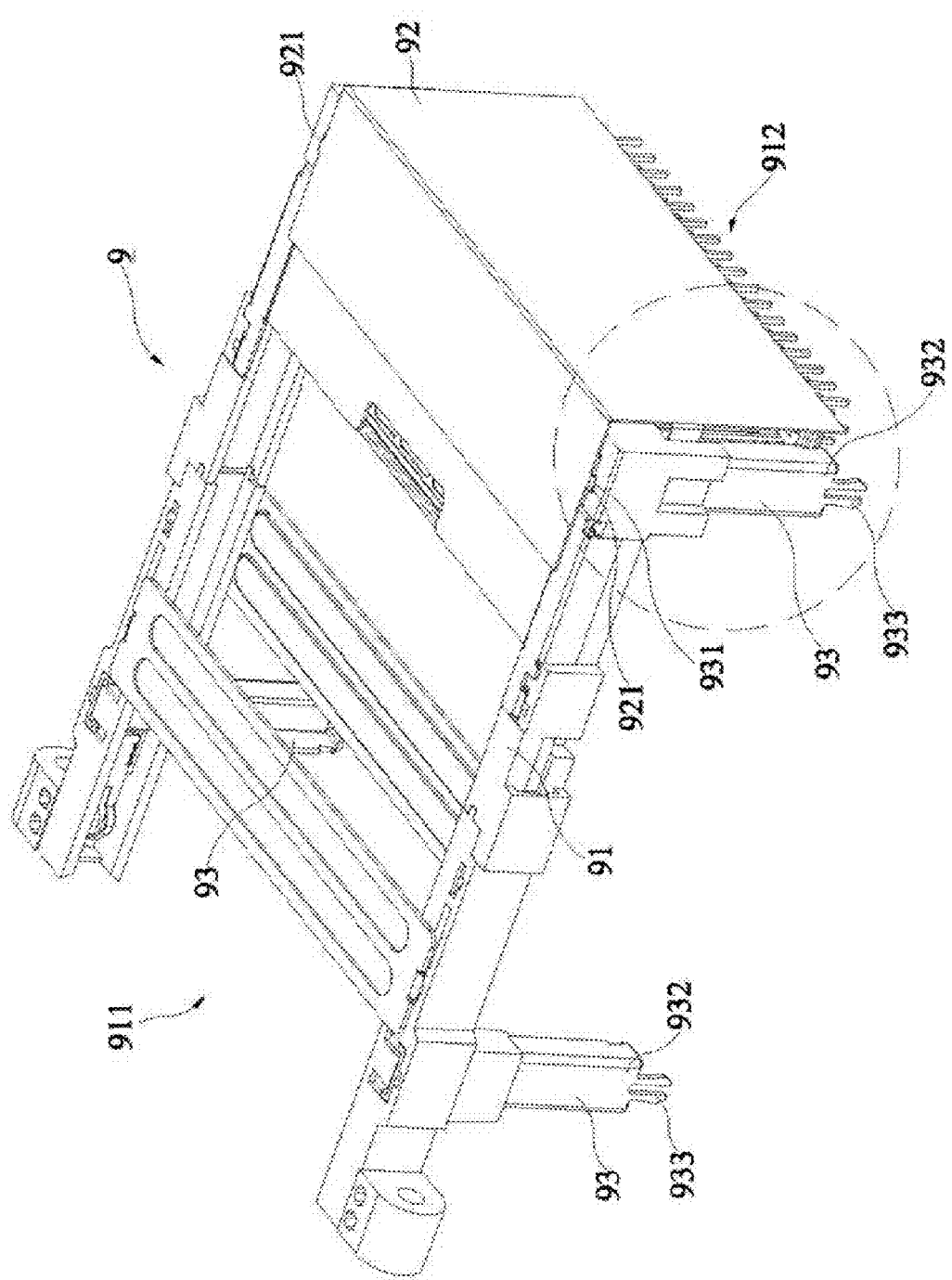
FIG. 1 is a perspective view of a traditional expansion card slot structure.
Figure 2:
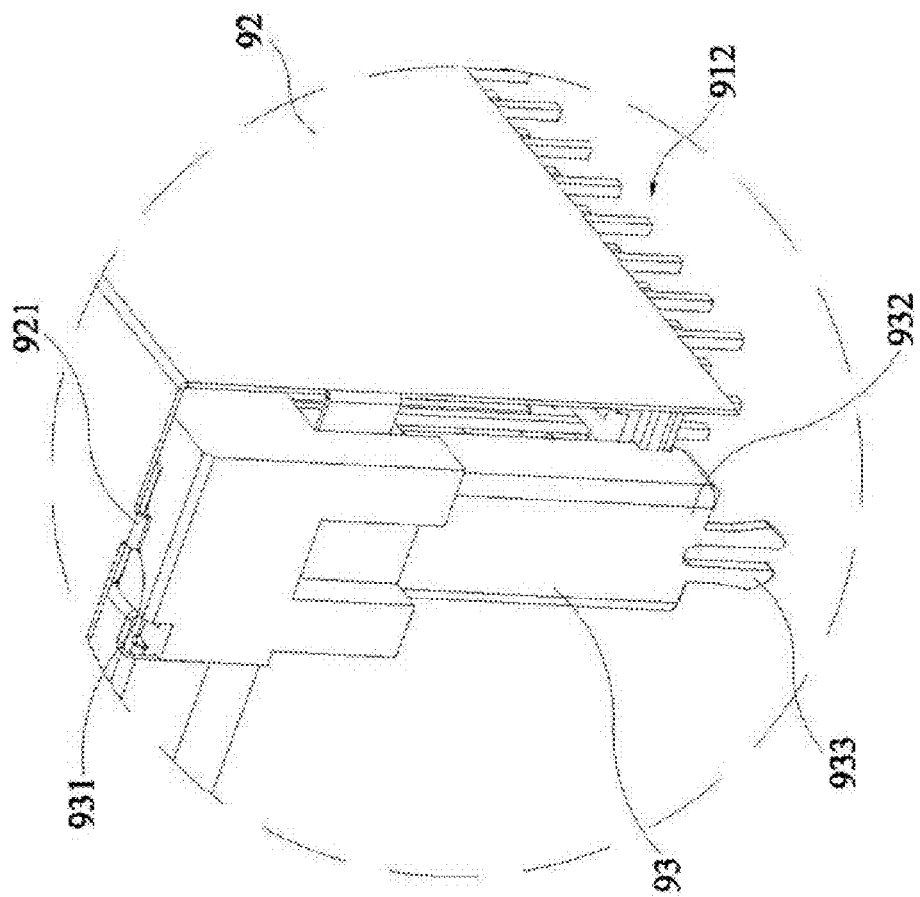
FIG. 2 is an enlarged view of FIG. 1.
Figure 3:
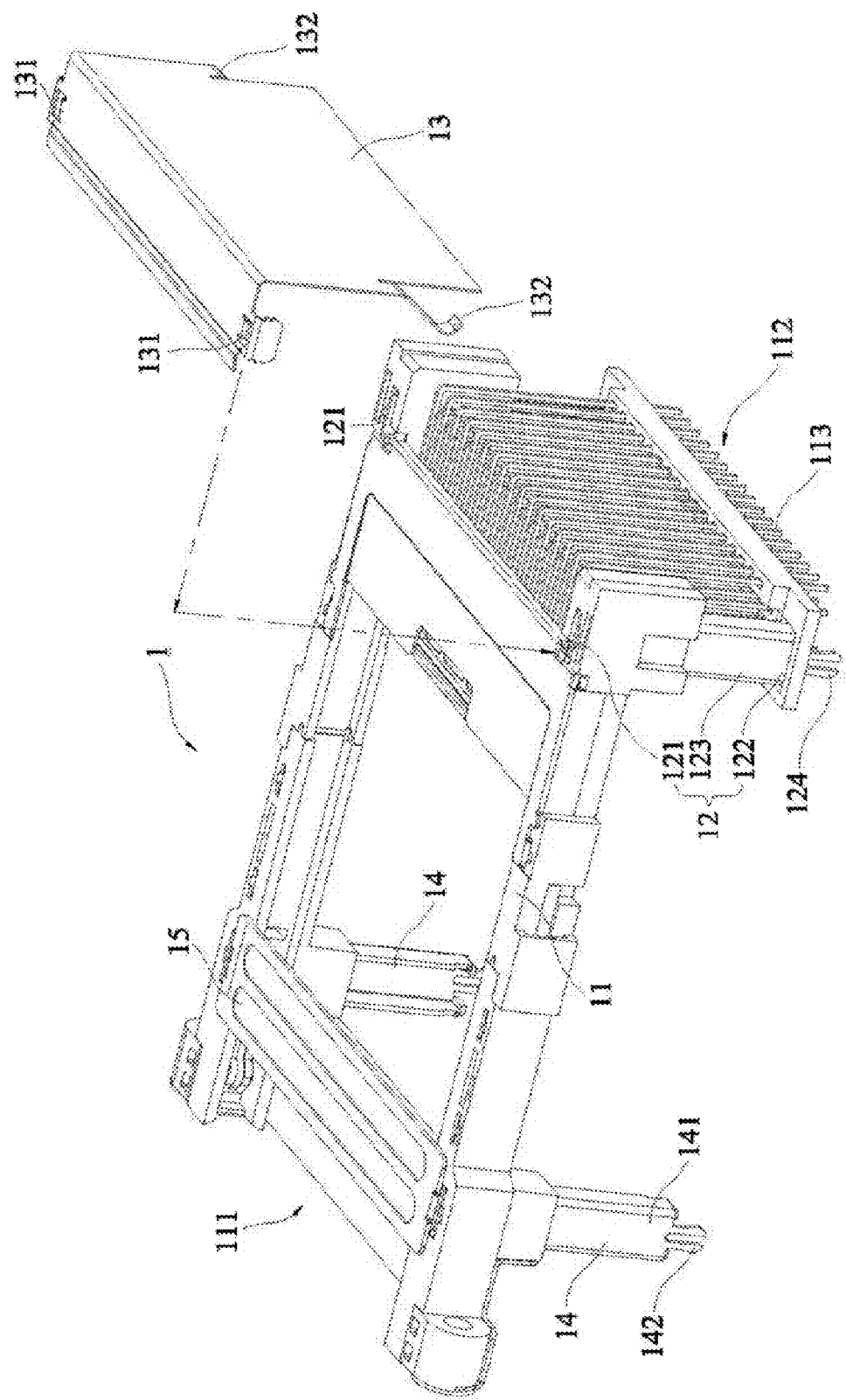
FIG. 3 is an exploded view of a preferred embodiment of the present invention.
Figure 4:
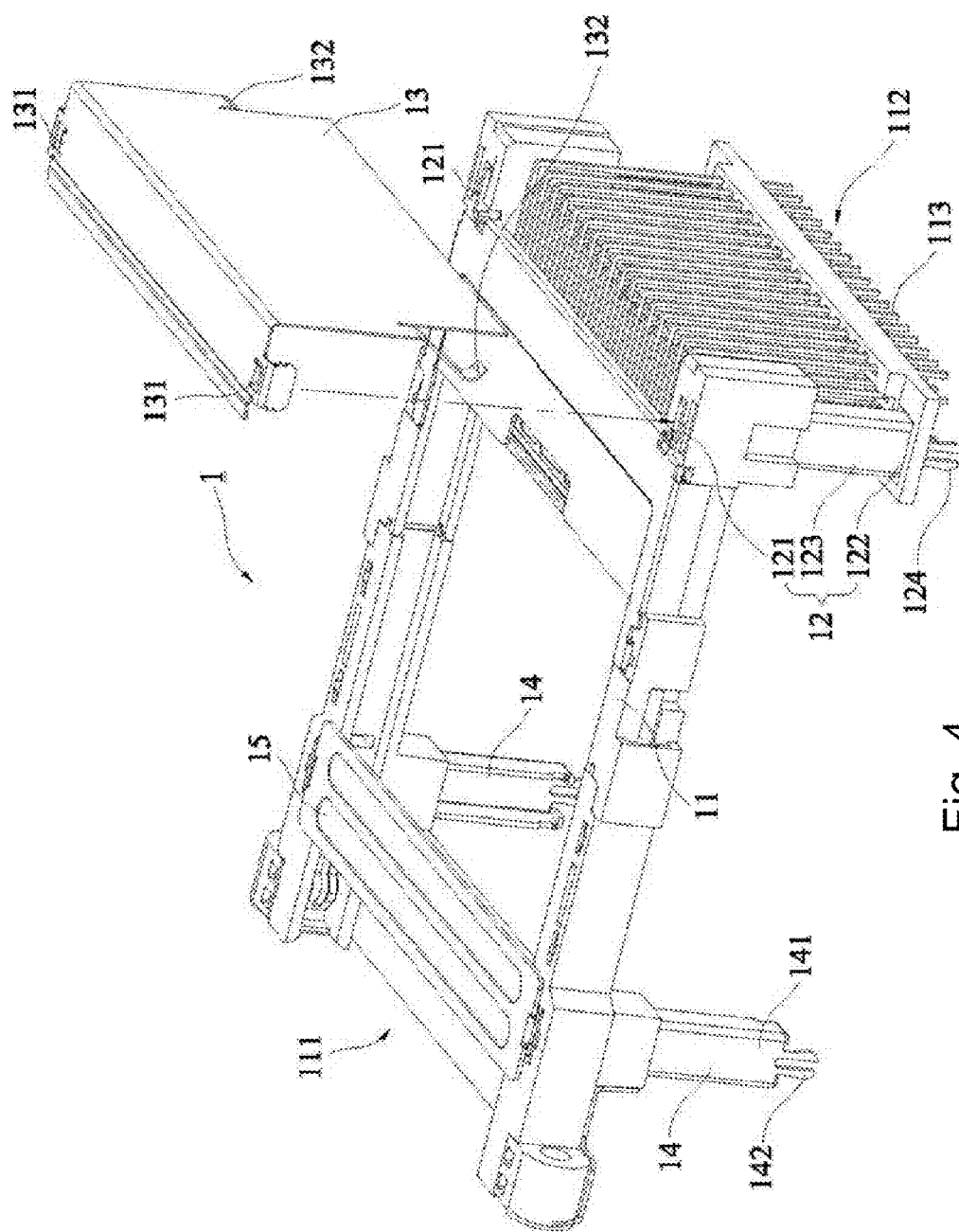
FIG. 4 is another exploded view of a preferred embodiment of the present invention.
Figure 5:
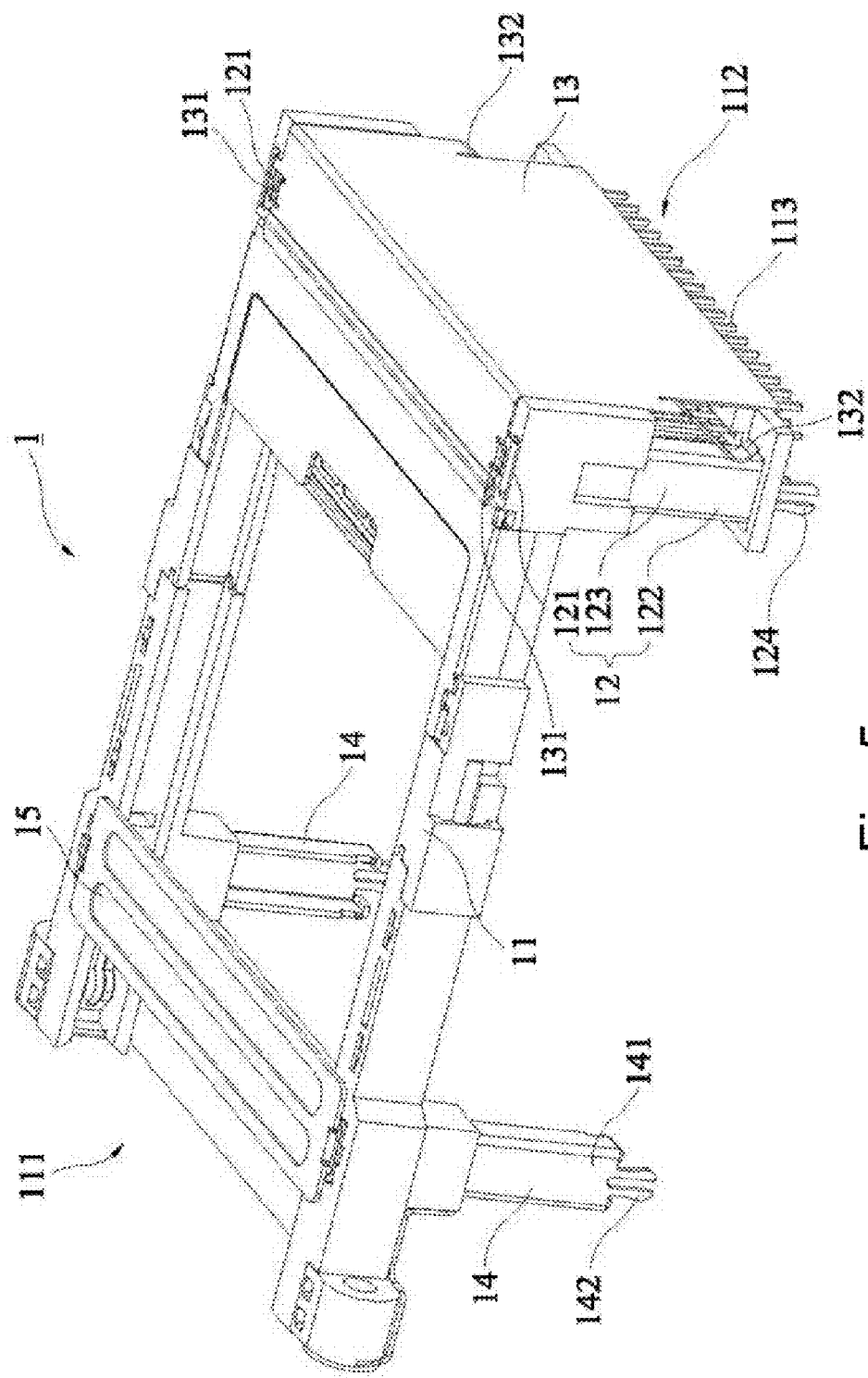
FIG. 5 is a perspective view of a preferred embodiment of the present invention.

Referring to FIGS. 3 to 5 for the detailed description of a preferred embodiment of the present invention, FIG. 3 shows an exploded view, FIG. 4 shows another exploded view and FIG. 5 shows a perspective view of the preferred embodiment of the invention. The improved expansion card slot structure 1 comprises a slot base 11, a plurality of rear-end fixing pins 12 and a shield bracket 13.

The slot base 11 includes a front-end insert slot 111 and a rear-end port 112, wherein the front-end insert slot 111 is a slot for installing an expansion card (not shown in the figure) such as a wireless network card, a memory card and an external hard disk, etc. In the preferred embodiment, the rear-end port 112 of the slot base 11 includes a plurality of electric pins 113.

The plurality of rear-end fixing pins 12 are installed at the slot base 11 and disposed proximate to the rear-end port 112 of the slot base 11, and each rear-end fixing pin 12 includes a main body portion 123, an upper end 121 and a lower end 122. In this embodiment, there are two rear-end fixing pins 12 and only one of them is shown in the figure due to the viewing angle, and the other one (disposed on the opposite side) is not shown in the figure.

The shield bracket 13 is installed at the slot base 11 and covered onto the rear-end port 112 of the slot base 11, and the shield bracket 13 includes a plurality of contact portions 131 and a plurality of elastic arms 132, wherein each contact portion 131 is in contact with the upper end 121 of each rear-end fixing pin 12, and each elastic arm 132 is in contact with a main body portion 123 of each rear-end fixing pin 12 and disposed proximate to the lower end 122 of each rear-end fixing pin 12.

The improved expansion slot card structure in accordance with the preferred embodiment of the invention further comprises a reinforcing rib 15 and a plurality of front-end fixing pins 14, wherein the reinforcing rib 15 is installed at the slot base 11 and disposed proximate to the front-end insert slot 111 of the slot base 11, and a plurality of front-end fixing pins 14 are installed at the slot base 11 and disposed proximate to the front-end insert slot 111 of the slot base 11. In the figure, two front-end fixing pins 14 are shown.

The lower end 122 of each rear-end fixing pin 12 includes a rear-end latch portion 124. Similarly, each front-end fixing pin 14 includes a lower distal portion 141, and the lower distal portion 141 of each front-end fixing pin 14 includes a front-end latch portion 142. During the assembling process, the rear-end latch portion 124 of each rear-end fixing pin 12 and the front-end latch portion 142 of each front-end fixing pin 14 are latched and installed onto a main board (not shown in the figure).

With the plurality of contact portions 131 and the plurality of elastic arms 132 of the shield bracket 13, the number of electromagnetic interference (EMI) contact points is increased, and each elastic arm 132 of the shield bracket 13 is in contact with the main body portion 123 of each rear-end fixing pin 12 and disposed proximate to the lower end 122 of each rear-end fixing pin 12, and thus the invention provides a shorter path for grounding and eliminating the noises, so as to improve the electromagnetic interference (EMI) effect and extend the life expectancy of the electronic devices.

In summation of the above description, the present invention herein enhances the performance than the conventional structure and further complies with the patent application requirements and is thus duly filed for patent application. While the invention has been described by means of specific embodiments, numerous modifications and variations could be made thereto by those skilled in the art without departing from the scope and spirit of the invention set forth in the claims.

What is claimed is:

1. An improved expansion card slot structure, comprising:
   a slot base, including a front-end insert slot and a rear-end port;
   a plurality of rear-end fixing pins, installed at the slot base and disposed proximate to the rear-end port, and each rear-end fixing pin including a main body portion, an upper end and a lower end; and
   a shield bracket, installed at the slot base and covered onto the rear-end port, and including a plurality of contact portions and a plurality of elastic arms, and each contact portion being in contact with the upper end of each rear-end fixing pin, and each elastic arm being in contact with the main body portion of each corresponding rear-end fixing pin and disposed proximate to the lower end of each rear-end fixing pin.

2. The improved expansion card slot structure of claim 1, further comprising a plurality of front-end fixing pins installed at the slot base and disposed proximate to the front-end insert slot.

3. The improved expansion card slot structure of claim 1, further comprising at least one reinforcing rib installed at the slot base and disposed proximate to the front-end insert slot.

4. The improved expansion card slot structure of claim 1, wherein the rear-end port includes a plurality of electric pins.

5. The improved expansion card slot structure of claim 1, wherein the lower end of each rear-end fixing pin includes a rear-end latch portion.

6. The improved expansion card slot structure of claim 1, wherein each front-end fixing pin includes a lower distal portion, and the lower distal portion of each front-end fixing pin includes a front-end latch portion.

* * * * *